(12) United States Patent
Saka

(10) Patent No.: US 6,244,876 B1
(45) Date of Patent: Jun. 12, 2001

(54) BUSBAR LAMINATE ASSEMBLY

(75) Inventor: Yuuji Saka, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/265,898

(22) Filed: Mar. 11, 1999

(30) Foreign Application Priority Data

Mar. 13, 1998 (JP) .................................................. 10-063084

(51) Int. Cl.$^7$ ........................................................ H01R 9/09
(52) U.S. Cl. ............................................... 439/76.2; 174/59
(58) Field of Search .......................... 174/59, 68.1, 68.2, 174/70 B, 71 B, 72 B; 439/949, 76.2

(56) References Cited

U.S. PATENT DOCUMENTS

| | | |
|---|---|---|
| 4,057,843 | 11/1977 | Saligny . |
| 4,781,621 | 11/1988 | Sugiyama et al. . |
| 5,023,752 | 6/1991 | Detter et al. . |
| 5,067,905 * | 11/1991 | Matsumoto et al. ................ 439/76.2 |
| 5,144,530 * | 9/1992 | Cohen et al. ......................... 361/675 |
| 5,322,445 * | 6/1994 | Ozaki et al. .......................... 439/212 |
| 5,525,758 | 6/1996 | Kurata . |
| 5,747,737 * | 5/1998 | Waehner ................................. 174/59 |
| 5,759,053 * | 6/1998 | Sugiyama ........................ 439/76.2 X |
| 5,980,302 * | 11/1999 | Saka ..................................... 439/949 |
| 6,077,102 * | 6/2000 | Borzi et al. ..................... 439/76.2 X |

FOREIGN PATENT DOCUMENTS

| | | |
|---|---|---|
| 388058 | 9/1990 | (EP) . |
| 414188 | 2/1991 | (EP) . |

* cited by examiner

*Primary Examiner*—Dean A. Reichard
*Assistant Examiner*—Dhiru R Patel
(74) *Attorney, Agent, or Firm*—Greenblum & Bernstein, P.L.C.

(57) ABSTRACT

The present invention provides a busbar laminate assembly structure. The invention includes a plurality of busbars each having a bent portion, and a plurality of terminal strips, a respective of the plurality of terminal strips depending from a respective bent portion of the busbar. Additionally, a plurality of insulation plates are provided, a respective insulation plate located above a respective busbar and adapted to electrically isolate each respective busbar. The insulation plates include a through-hole adapted to accept a terminal strip therethrough, and a fastening hole adapted to fasten a terminal strip is provided, the fastening hole being provided in the insulation plate farthest from the bent portion of the terminal strip.

14 Claims, 6 Drawing Sheets

BUSBAR LAMINATE ASSEMBLY

BACKGROUND OF THE INVENTION

1. Field of the Invention

The present invention relates to a busbar laminate assembly structure to be housed in an electrical connection box, and more specifically to a busbar laminate assembly structure in which a plurality of busbars is assembled in a laminated form under an electrically isolated condition through an insulation plate.

2. Description of the Related Art

An electrical connection box is used for housing electrical equipment containing various electrical circuits and electronic components for automobiles and the like, and is also used as a connection junction for wire harnesses and the like.

Generally, in an electrical connection box, a busbar is housed as a wiring board connected with terminals of various electrical equipment. Such a busbar forms a laminated structure, thereby making it possible to produce complicated wiring.

Below follows a description of the conventional assembly structure of such busbars in reference to FIGS. 5–7. As shown in FIG. 5, a wiring board 40 is formed of first to fourth busbars 1F to 4F formed with certain respective wiring patterns, and first to fourth insulation plates IP1 to IP4 which electrically isolate respective laminates between busbars 1F to 4F.

As shown in FIGS. 5 and 6, respective terminal strips 41 to 44 are bent to a vertical direction (i.e., orthogonal to the busbars and insulation plates) at a predetermined position of respective laminate of busbars 1F to 4F. The length of respective terminal strips 41 and 44 are set so that the strips are positioned of the same height in a laminate assembled condition as described later. Therefore, the terminal strip 41 of the first laminate busbar 1F is set as the shortest terminal strip while the terminal strip 44 of the fourth laminate busbar 4F is the longest terminal strip.

At the position corresponding to the aforementioned respective terminal strips 41 to 44 on the first laminate insulation plate IP1, through-holes 51a to 51d are respectively provided. At the second laminate insulation plate IP2, a fastening hole 52 is provided at a position corresponding to the terminal strip 42, while through-hole 53a and 53b are provided at the positions corresponding to respective terminal strips 43 and 44. At the third laminate insulation plate IP3, a fastening hole 54 is provided at the position corresponding to the terminal strip 43, while a through-hole 55 is provided at the position corresponding to the terminal strip 44. At the fourth laminate insulation plate IP4, a fastening hole 56 is provided at the position corresponding to the terminal strip 44.

The respective through-holes 51a to 51d, 53a, 53b, and 55 are each provided on respective laminate insulation plates IP1 to IP4 form a rectangular hole, with its shorter dimension t2 being greater than the plate thickness t1 for the aforementioned respective terminal strips 41 to 44, thereby making it possible for respectively corresponding terminal strips 41 to 44 to easily be inserted into respective through-holes 51a to 51d, 53a, 53b, and 55. In addition, the fastening hole 52, 54 and 56 form a tapered opening in an inserting direction for receiving respective terminal strips 42 to 44 as shown in FIG. 6. The width of the upper edge of the fastening hole 52, 54, and 56 is narrower than the plate thickness t1 of the respective terminal strips 41 to 44. Terminal strips 42 to 44 can thus be press-fit into respective fastening holes 52, 54, and 56.

As shown in FIG. 6, each laminate of busbars 1F to 4F is assembled in a laminated state, by press-fitting each of the terminal strips 42 to 44 into a respective fastening hole 52, 54 and 55; and by inserting respective terminal strips 41 to 44 into respective corresponding through-holes 51a to 51d, 53a, 53b, and 55. In this case, the lowest portion of the base edge (i.e., the bent portion) 42', 43' and 44' of respective terminal strips 42 to 44 is held and then fastened between the fastening holes 52, 54, and 56, respectively.

It is necessary to bend the terminal strips 41 to 44 in such a manner that each forms a right angle to respective laminate busbars 1F to 4F. Since the bending for terminal strips 41 to 44 is subjected to plastic deformation and retains a slight elastic rebound, there is a limit to the bending accuracy for the respective terminal strips 41 to 44. Therefore, since it is difficult to bend respective terminal strips accurately to the vertical direction (i.e., orthogonal to the busbars), the normal state of terminal strips 41 to 44 has often been slightly obliquely inclined from the vertical direction.

For example, when the terminal strip 44 on tie fourth laminate busbar 4F is bent under a slightly inclined state, as shown in FIG. 7, the terminal strip 44 becomes inclined by an angle θ from the original position (i.e., vertical), as illustrated with a two-dot chain line, even when in a laminate assembled condition. This inclination is caused by a shorter dimension t2 of the respective through-holes 51d, 53b, and 55 being set wider than the thickness t1 of the terminal strip 44, thereby contributing to the degree of freedom of the terminal strip 44 that exists in the through-holes 51d, 53b, and 55; and the terminal strip 44 being held and then fastened only on the nearest fastening hole 56 to the bent portion. The terminal strip 44 is thus inclined by angle θ, the top edge position of terminal strip 44 comes to a position shifted by a distance d from the original position.

Consequently, positioning difficulties have been encountered when mounting a connector, electrical component, and the like on the terminal strip 44. The difficulty of insertion/withdrawal of connectors, electrical components, and the like to the terminal strip becomes greater, thereby causing possible mounting failures.

It is thus desirable to provide a busbar laminate assembly structure capable of maintaining the bending accuracy of the terminal strip bent under the busbar laminate.

SUMMARY OF THE INVENTION

The present invention provides a busbar laminate assembly structure. The invention includes a plurality of busbars each having a bent portion, and a plurality of terminal strips, a respective terminal strip depending from a respective bent portion of each busbar. Additionally provided is a plurality of insulation plates, a respective insulation plate located above a respective busbar and adapted to electrically isolate each respective busbar. The insulation plates comprise a through-hole adapted to accept a terminal strip therethrough, and according to one aspect of the invention, a fastening hole adapted to fasten a terminal strip is provided, the fastening hole being provided on the insulation plate farthest from the bent portion of the terminal strip. Additionally, the width of the fastening hole may be greater than, less than or equal to the thickness of the terminal strip. The fastening hole may further include a tapered opening to facilitate the insertion of the terminal strip According to another aspect of the invention, a protrusion is provided on the terminal strip, the projection being adapted to press-fit a terminal strip to a through-hole.

According to a further aspect of the invention, the projection of each terminal strip is present between a predetermined distance from the tip of the terminal strip and the bent portion.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE PREFERRED EMBODIMENTS

Figure 1:
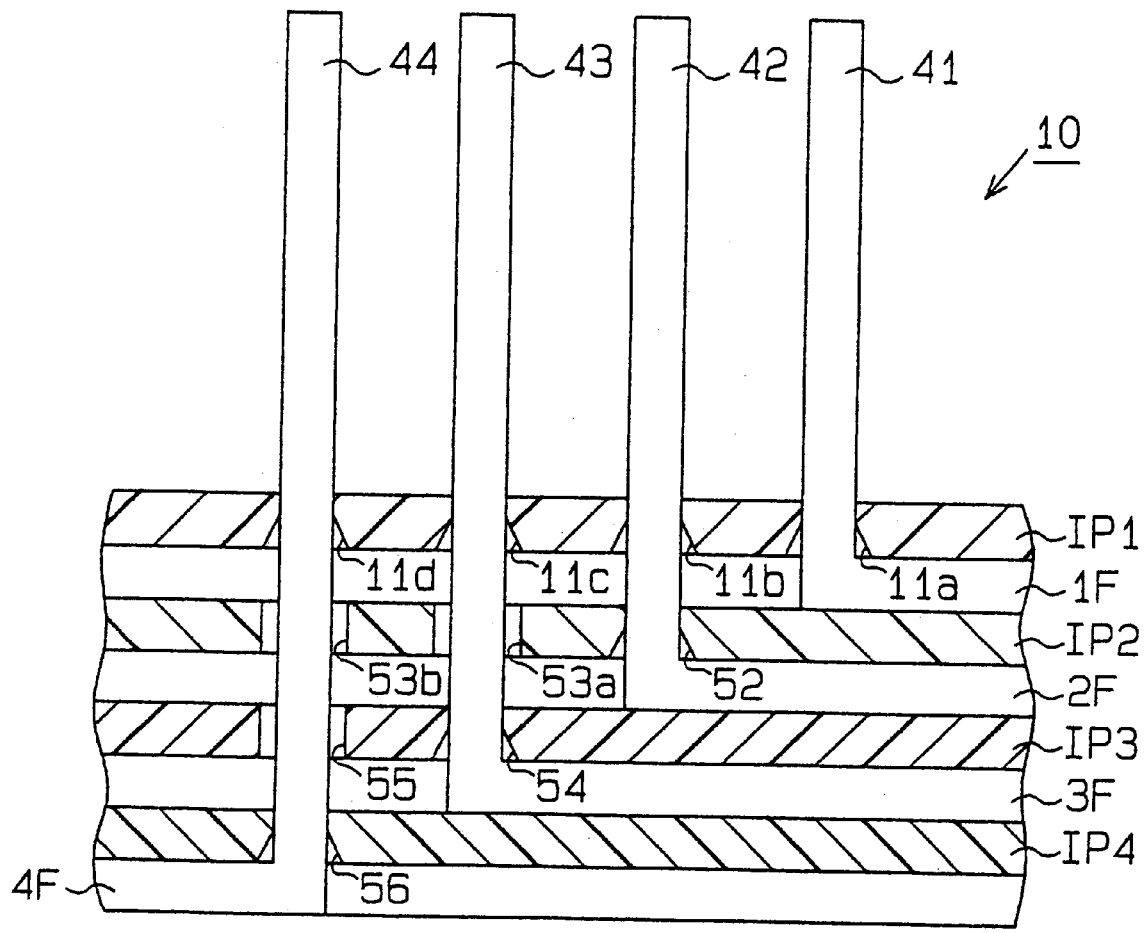
FIG. 1 represents a sectional view showing a first embodiment of the present invention.

Referring now to the drawings wherein like numerals represent like elements, FIG. 1 shows a first embodiment of the present invention.

Figure 5:
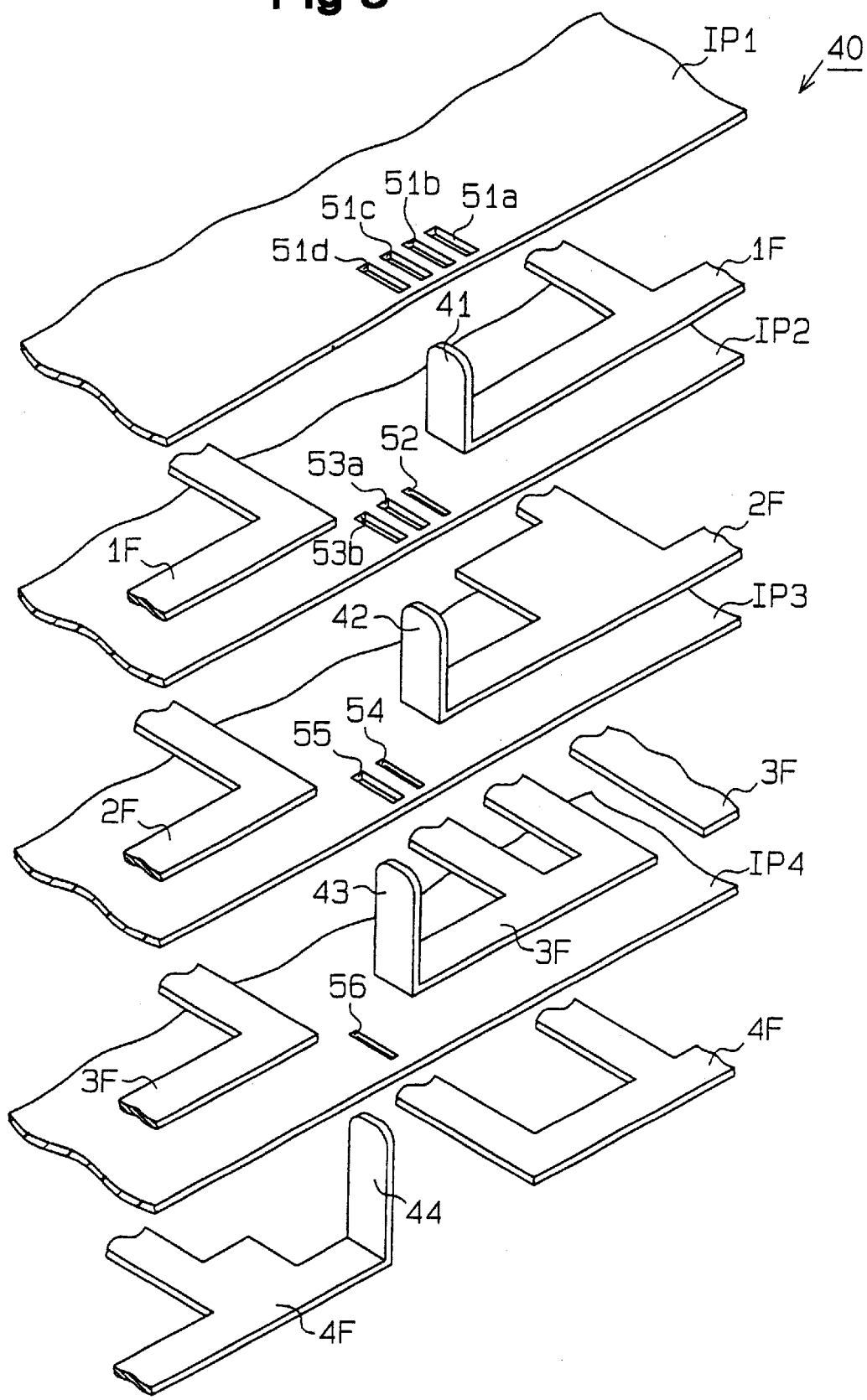
FIG. 5 represents an exploded perspective view of the prior art.
Figure 6:
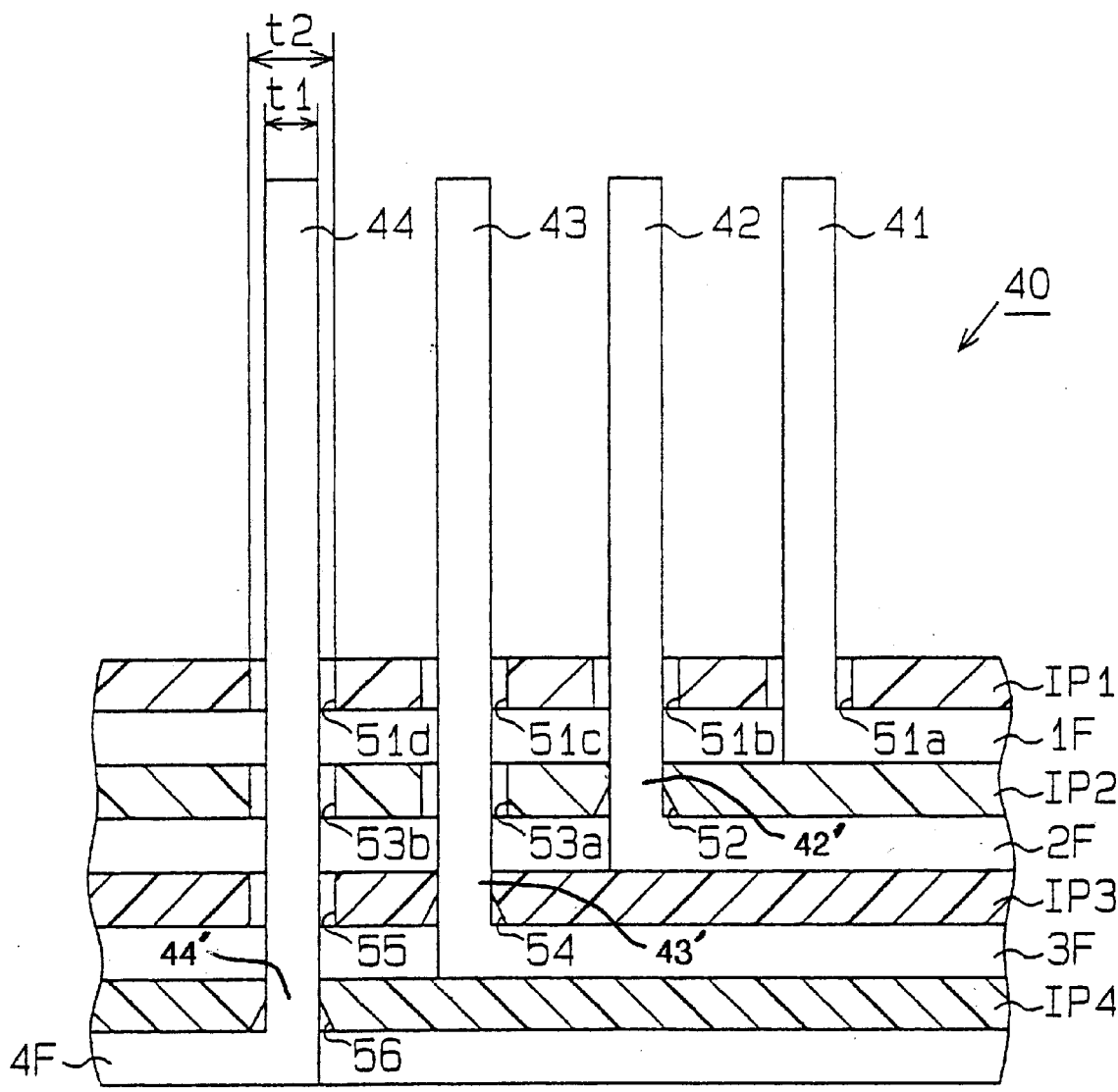
FIG. 6 represents a sectional view of the prior art.
Figure 7:
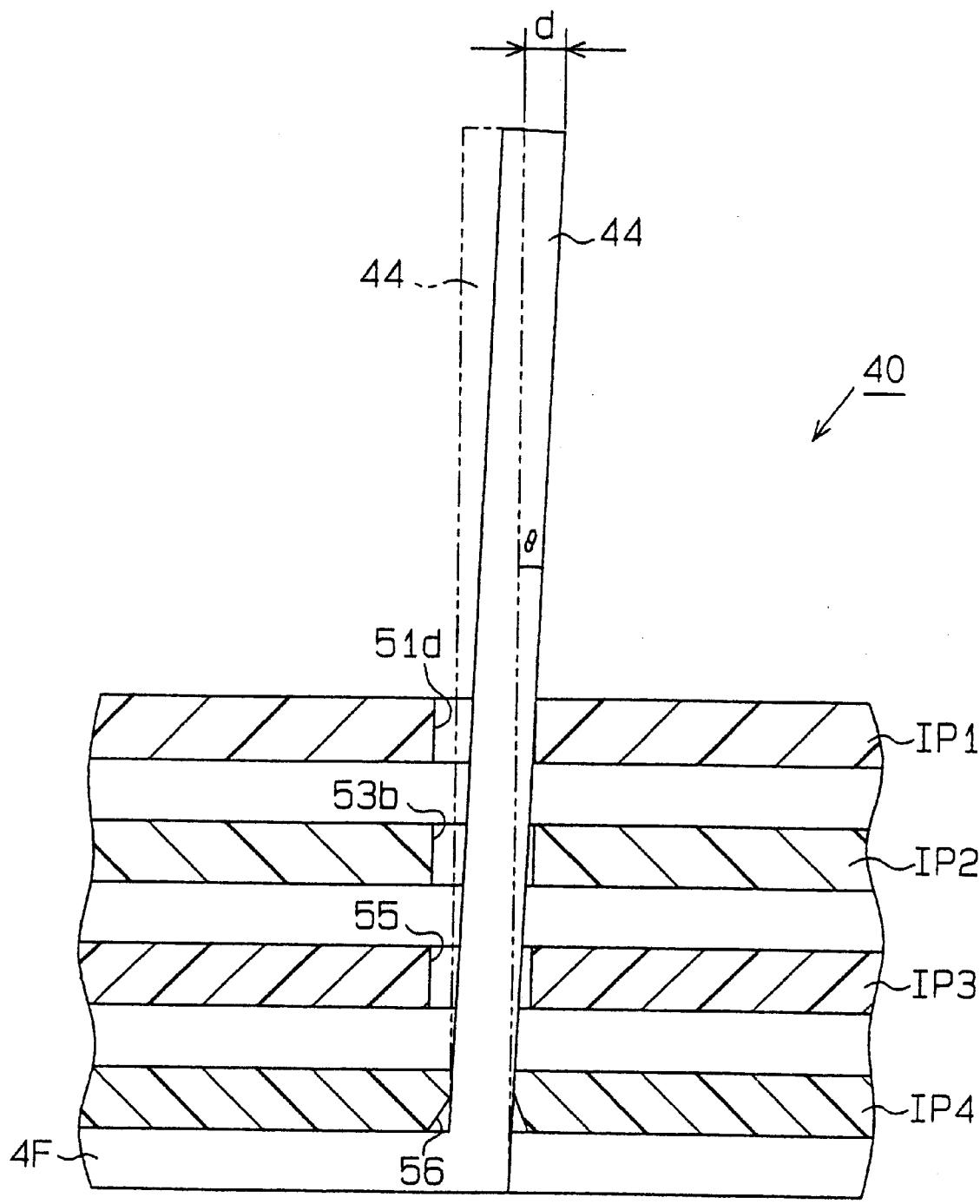
FIG. 7 represents a sectional view of the prior art showing a single terminal strip.

For the same elements as the prior art configuration shown in FIGS. 5–7, the same reference numerals are used, thereby omitting the necessity of further description.

As shown in FIG. 1, a wiring board 10 is provided having first to fourth laminate busbars 1F to 4F and first to fourth laminate insulation plates IP1 to IP4 in the same manner as the aforementioned prior art configuration of FIGS. 5–8. At the position corresponding to each of terminal strips 41 to 44 of each laminate of busbars 1F to 4F, fastening holes 11a to 11d, are respectively provided on the first insulation plate IP1. Each fastening hole 11a to 11d forms a tapered opening in an insertion direction of each terminal strip 41 to 44. Each laminate of busbars 1F to 4F and each laminate of insulation plates IP1 to IP4 is assembled in a laminated condition in the same manner as the aforementioned prior art configuration. In the first embodiment, on the first laminate insulation plate IP1, assembly is carried out by press-fitting each terminal strips 41 to 44 through respective fastening holes 11a to 11d, each corresponding to a respective terminal strip 41 to 44. Since each of the fastening holes 11a to 11d forms a tapered opening in the insertion direction of each of terminal strips 41 to 44, even if each of terminal strips 41 to 44 is bent in an inclined state to the vertical direction (i.e., orthogonal to the busbars), the terminal strips can easily be press-fit, as the terminal strips are guided along the tapered surface of fastening holes 11a–11d.

When assembled, the terminal strip 41 of the first laminate busbar 1F is held and fastened in the fastening hole 11a of the first laminate insulation plate IP1. In addition, the terminal strip 42 of the second laminate busbar 2F is held and fastened in both the fastening hole 11b of the first laminate insulation plate IP1 and the fastening hole 52 of the second laminate insulation plate IP2. Similarly, the terminal strip 43 of the third laminate busbar 3F is held and fastened in both the fastening hole 11c of the first laminate insulation plate IP1 and the fastening hole 54 of the third laminate insulation plate IP3. The terminal strip 44 of the fourth laminate busbar 4F is held and fastened in both the fastening hole 11d of the first laminate insulation plate IP1 and the fastening hole 56 of the fourth laminate insulation plate IP4.

Therefore, with the each of terminal strips 41 to 44 held and fastened in each of fastening holes 11a to 11d of the first laminate insulation plate IP1, and respective busbars 1F to 4F and each insulation plates IP1 to IP4 are assembled in a laminated state, the separation of the insulation plate is prevented. As a result, after assembling a wiring board 10 in a laminated state at a production line, separation of the busbars 1F to 4F and insulation plates IP1 to IP4 is prevented when transferring the wiring board 10 to the next assembly process. Therefore, control of the laminated wiring board 10 is facilitated.

Furthermore, the terminal strip 44 is held and fastened between two fastening holes 56 and 11d, namely, a fastening hole 56 of the fourth laminate insulation plate IP4 positioned nearest to the bent portion, and a fastening hole 11d of the first laminate insulation plate IP1 positioned furthest from the bent portion. Therefore, even when the terminal strip 44 is bent in an oblique state from the vertical position, the terminal strip 44 is rectified from the oblique state to the vertical direction with high accuracy by respective fastening holes 56 and 11d. Furthermore, other terminal strips 41 to 43 are rectified from an oblique state to the vertical directions with high accuracy by being held and fastened by each of the fastening holes 11a to 11c, 52, and 54.

Since the terminal strip 41 is held and fastened solely by the fastening hole 11a, the rectifying force to the vertical direction of the terminal strip 41 at the fastening hole 11a is small relative to the required rectifying force of the other terminal strips. However, terminal strip length becomes progressively smaller from the terminal strip 44 to terminal strip 41. Therefore, even when each of the terminal strips 41 to 44 is inclined to an oblique state with the same angle, the shifted amounts at the tip is the least at terminal strip 41. Therefore, all respective terminal strips 41 to 44 may be maintained in the vertical direction with high accuracy, even though terminal strip 41 is held and fastened solely by the fastening hole 11a.

Each of the terminal strips 41 to 44 is held and fastened under the laminated assembly of the wiring board 10 in the corresponding fastening holes 11a to 11d respectively. The bending accuracy of each of terminal strips 41 to 44 is thus accurately maintained under the same condition. Therefore, electronic components and the like may be easily positioned when mounting such components to the respective terminal strips 41 to 44. Also, the resistance for insertion and withdrawal is reduced for a connectors or electronic components mounted to the terminal strips 41 to 44, thereby reducing the possibility of mounting failures of electronic components and the like.

For instance, in an assembly or production line, after mounting and laminating a wiring board 10, possible separation of the busbars 1F to 4F from insulation plates IP1 to IP4 is reduced during transport to the next assembly process. Furthermore, handling of the laminated wiring board 10 is facilitated.

Each of the fastening holes 11a to 11d, 52, 54, and 56 form a tapered portion facing the insertion direction of each of the terminal strips 41 to 44. Thus, when each of the terminal strips 41 to 44 is bent in an obliquely inclined state from the vertical direction, insertion of the terminal strips can easily be made through each of the tapered fastening holes 11a to 11d, 52, 54 and 56.

Figure 2:
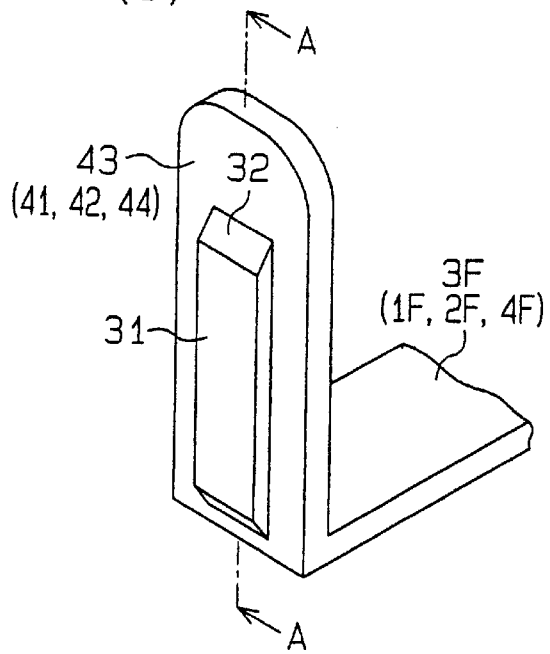
FIG. 2(a) represents a perspective view showing a terminal strip of a second embodiment of the present invention.
FIG. 2(b) represents a sectional view of the second embodiment as seen from a line A—A in FIG. 2(a)
Figure 2:
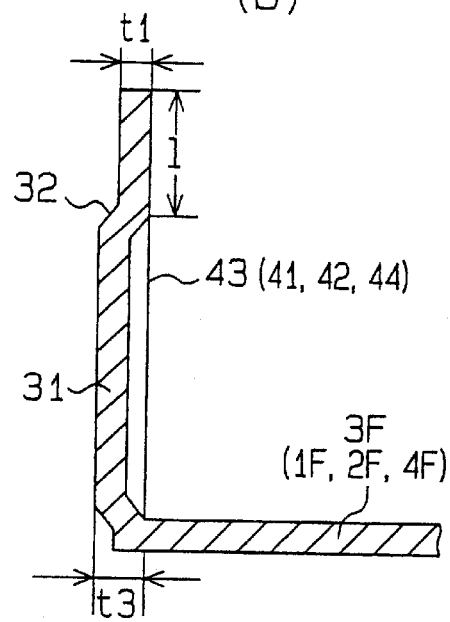
Figure 3:
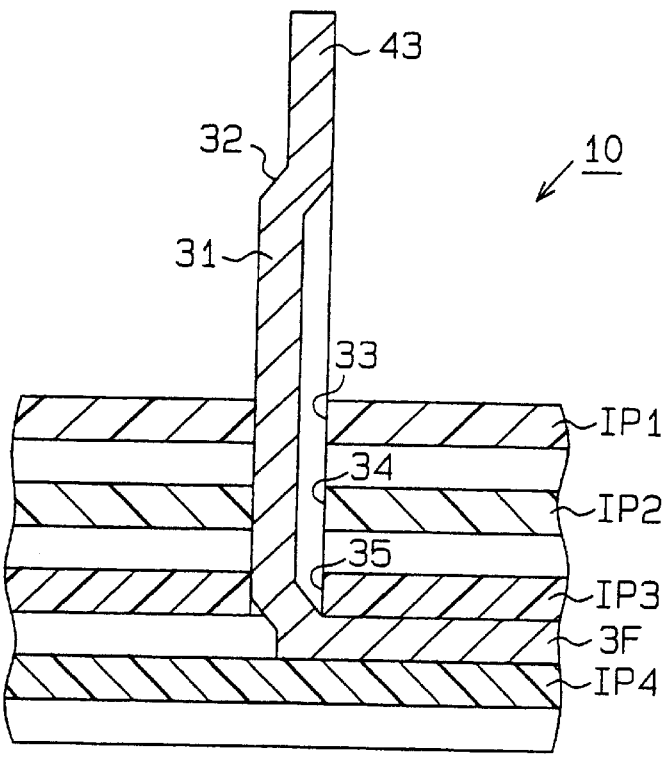
FIG. 3 represents a sectional view showing the second embodiment.

Referring to FIGS. 2(a) and (b) and FIG. 3, a second embodiment of the present invention is shown.

To further assist in the securing of the terminal strips 41 to 44 to the respective fastening holes 11a to 11d, it is preferable that the width of the fastening holes be no greater than the thickness of the terminal strips. Alternatively, the width of the fastening holes 11a to 11d may be less than the thickness of the terminal strips 41 to 44. Furthermore, it may also be preferable that the area of the fastening holes be no greater than the cross-sectional area of the terminal strips. Alternatively, the area of the fastening holes 11a to 11d may be less than the cross-sectional of the terminal strips 41 to 44.

As shown in FIGS. 2(a) and (b), a parallel protrusion 31 is provided on the bent portion at a predetermined distance from the tip of the terminal strip 43 of the third laminate busbar 3F. The protrusion 31 is formed by punching the terminal strip 43 with a press or the like, and the total thickness t3 of the terminal strip 43 can be set to the same thickness or slightly thicker than width of each of the through-holes 53a, 53b, and 55 in the first embodiment. In addition, on the upper edge of the protrusion 31, a tapered surface 32 is provided.

As shown in FIG. 3, at the position corresponding to the terminal strip 43 in the first to third laminate insulation plates IP1 to IP3, through-holes 33 to 35 are provided. These through holes 33 to 35 are similarly configured to through-holes 53a, 53b, and 55 of the first embodiment. The terminal strip 43 is inserted successively through each through-hole 33 to 35 without clearance. Even if the terminal strip 43 is bent in an obliquely inclined state from the vertical position, the terminal strip 43 can be accurately rectified to the vertical direction by each through-hole 33 to 35.

When the terminal strip 43 is bent in a state obliquely inclined from the vertical position, the terminal strip may be easily inserted into respective through-holes 33 to 35 because the protrusion 31 is riot provided on the tip of the terminal strip 43. Furthermore, the upper end of the protrusion 31 is provided with a tapered surface 32. The terminal strip 43 is inserted through the through-holes 33 to 35 and is guided by the tapered surface 32. Therefore, even when the terminal strip 43 is bent in a state obliquely inclined from the vertical position, insertion through the through-holes 33 to 35 of the terminal strip 43 is facilitated.

Description is made only for the terminal strip 43 of the third laminate busbar 3F, but because the structure of each of terminal strips 41, 42, and 44 of other respective laminate busbars 1F, 2F and 4F is structurally identical to the terminal strip 43, description of terminal strips 41, 42 and 44 is thus omitted. In addition, at the position corresponding to each of the terminal strips 41, 42 and 44 on respective insulation plates IP1 to IP4, through-holes (not shown) structurally identical to through-holes 33 to 35 are provided.

When each terminal strip 41 to 44 is bent in a state obliquely inclined from the vertical direction, the bending accuracy of each terminal strip 41 to 44 is maintained in the laminated wiring board 10 because the oblique inclination is rectified to the vertical direction by each of the through-holes 33 to 35 (through-holes corresponding to terminal strips 41, 42 and 44 are not shown). Therefore, positioning is facilitated when mounting electronic components and the like to the terminal strips 41 to 44. The resistance to insertion/withdrawal of connectors, electrical components, and the like to the terminal strips 41 to 44 is reduced, thereby reducing mounting failures of electrical components and the like.

When a total thickness t3 of the terminal strip 43 is slightly greater than the width of the through-holes 33 to 35, it becomes difficult to separate each laminate of busbars 1F to 4F from each laminate of insulation plates IP1 to IP4 of a laminated board 10. It also becomes difficult to separate the laminate of busbars 1F to 4F from each laminate of insulation plates IP1 to IP4 when the cross sectional area of the terminal strip 43 is slightly greater than the width of the through-holes 33 to 35. Therefore, after laminated assembly at a production line, for example, possible separation between the busbars 1F to 4F and the insulation plates IP1 to IP4 is reduced when transporting the board 10 to the next assembly process. Moreover, control of the laminated wiring board 10 is facilitated.

Figure 4:
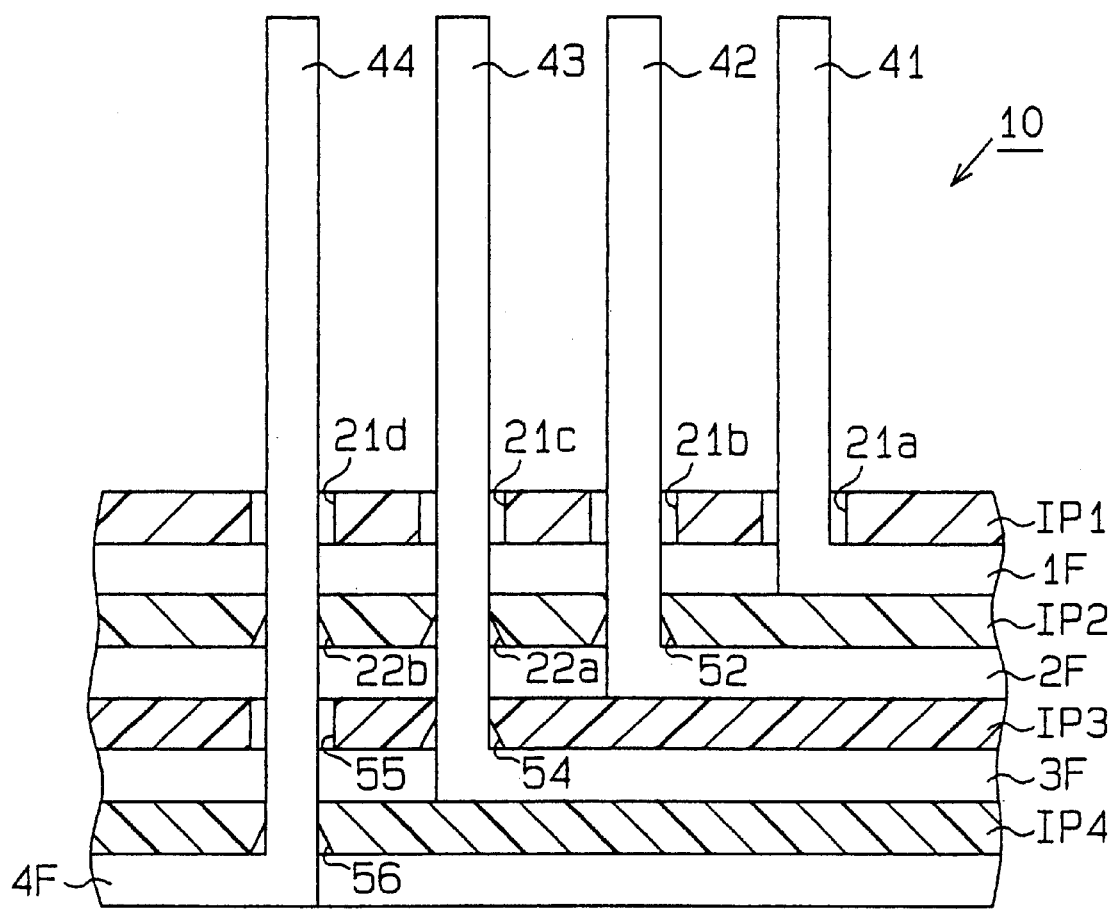
FIG. 4 represents a sectional view showing a third embodiment of the present invention.

Each of the aforementioned embodiments can be modified as follows:

In the first embodiment, each of the fastening holes 11a to 11d is respectively provided at the position corresponding to respective terminal strips 41 to 44 in the first laminate insulation plate IP1. As shown in FIG. 4, each of these fastening holes 11a to 11d may be embodied as through-holes 21a to 21d, and each of the through-holes 53a and 53b of the second laminate insulation plate IP2 may be embodied as fastening holes 22a and 22b. For example, with this modification, if the first laminate insulation plate IP1 is not a component of the wiring board 10 but is instead a housing component or the like, of electronic components separately formed for an electronic connection box (not shown), separation of the housing board or the like from the wiring board 10 can easily be made, thereby facilitating the performance of maintenance for the wiring board 10.

In the first embodiment, the through-holes 53a, 53b, and 55 may be changed to fastening holes 11, 52, 54, 56. In the first and second embodiments, the tip of each terminal strip 41 to 44 may be formed with a taper.

When the fastening holes 11, 52, 54, 56 have a tapered opening in an insertion direction of the terminal strip 41 to 44, the terminal strip can easily be inserted into a fastening hole. The busbar laminate assembly structure may have a tapered surface 32 on the edge of the tip side of the terminal strip 41 to 44 on the protrusion 31, whereby the terminal strip can be easily inserted into a fastening hole.

The terminal strip 41 to 44 can be held and fastened by a fastening hole 11, 52, 54, 56, making it possible to maintain high bending accuracy of the laminated terminal strip. Additionally, insertion into a through-hole 21a–21d, 33, 34, 35, 53a, 53b, 55 can easily be made even if the terminal strip 41 to 44 is bent in a condition obliquely inclined from the vertical position relative to the busbar 1F to 4F.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects.

Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present disclosure relates to subject matter contained in Japanese Utility Model Application No. JP 10-63084, filed Mar. 13, 1998, which is expressly incorporated herein by reference in its entirety.

What is claimed is:

1. A busbar laminate assembly comprising:
   a plurality of busbars, each having a bent portion;
   a plurality of terminal strips, a respective terminal strip depending from a respective bent portion of each busbar of said plurality of busbars;
   a plurality of insulation plates, a respective insulation plate located above a respective said busbar and adapted to electrically isolate said each said respective busbar;
   at least one of said plurality of insulation plates including a through-hole adapted to accept one of said plurality of terminal strips therethrough; and
   at least one of said plurality of insulation plates including a fastening hole adapted to fasten said one of said plurality of terminal strips, said fastening hole provided on one of said plurality of insulation plates at a position furthest from the bent portion of one of said plurality of busbars.

2. The busbar laminate assembly according to claim 1, wherein a width of said fastening hole is no greater than a thickness of the terminal strip.

3. The busbar laminate assembly according to claim 1, wherein an area of said fastening hole is no greater than a cross-sectional area of the terminal strip.

4. The busbar laminate assembly according to claim 1, wherein a width of said fastening hole is less than a thickness of the terminal strip.

5. The busbar laminate assembly according to claim 1, wherein an area of said fastening hole is less than the cross-sectional area of the terminal strip.

6. The busbar laminate assembly according to claim 1, wherein said fastening hole includes a tapered opening adapted to facilitate the insertion of said one of said plurality of terminal strips.

7. A busbar laminate assembly comprising:
   a plurality of busbars each having a bent portion, a plurality of terminal strips, each of said plurality of terminal strips depending from a respective bent portion of each busbar;
   a plurality of insulation plates, a respective insulation plate located above a respective busbar and adapted to electrically isolate each respective busbar;
   at least one of said plurality of insulation plates including a through-hole adapted to accept a terminal strip therethrough; and
   at least one of said terminal strips including a protrusion adapted to press-fit the terminal strip within said through-hole.

8. The busbar laminate assembly according to claim 7, wherein a width of said through hole is no greater than a thickness of the terminal strip.

9. The busbar laminate assembly according to claim 7, wherein an area of said through hole is no greater than a cross-sectional area of the terminal strip.

10. The busbar laminate assembly according to claim 7, wherein a width of said through hole is less than a thickness of the terminal strip.

11. The busbar laminate assembly according to claim 7, wherein an area of said through hole is less than a cross-sectional area of the terminal strip .

12. The busbar laminate assembly according to claim 7, wherein said protrusion includes a tapered surface adapted to facilitate insertion of said terminal strip.

13. The busbar laminate assembly according to claim 7, wherein each said terminal strip has a tip, and wherein said protrusion of said at least one terminal strip is positioned a predetermined distance from the tip.

14. The busbar laminate assembly according to claim 13, wherein said protrusion includes a tapered surface adapted to facilitate insertion of said terminal strip.

* * * * *